United States Patent [19]

Ericsson

[11] Patent Number: 4,565,478
[45] Date of Patent: Jan. 21, 1986

[54] MATERIALS HANDLING DEVICE

[75] Inventor: Sylve J. D. Ericsson, Tumba, Sweden

[73] Assignee: Svecia Silkscreen Maskiner AB, Norsborg, Sweden

[21] Appl. No.: 238,168

[22] Filed: Feb. 26, 1981

[30] Foreign Application Priority Data

Feb. 3, 1981 [SE] Sweden ................................. 8100787

[51] Int. Cl.⁴ ...................... B65G 57/04; B65G 60/00
[52] U.S. Cl. ......................................... 414/71; 271/12; 271/194; 271/225; 271/300; 414/72; 414/121; 414/900
[58] Field of Search ................... 414/72, 71, 121, 118, 414/900, 902, 750, 752; 271/12, 14, 300, 184, 225, 194, 258

[56] References Cited

U.S. PATENT DOCUMENTS

| | | | |
|---|---|---|---|
| 2,716,497 | 8/1955 | Wahl et al. ......................... | 414/72 X |
| 2,980,265 | 4/1961 | Johnson et al. ................... | 414/120 X |
| 3,770,140 | 11/1973 | Dukette ............................ | 414/752 X |
| 3,833,132 | 9/1974 | Alduk .............................. | 414/900 X |
| 3,884,368 | 5/1975 | Ballard ............................. | 414/121 |
| 3,947,016 | 3/1976 | Horung et al. ..................... | 271/12 |
| 4,065,118 | 12/1977 | Dudley ............................. | 414/752 X |
| 4,284,382 | 8/1981 | Silverman ......................... | 414/900 X |

FOREIGN PATENT DOCUMENTS 1341978 12/1973 United Kingdom .

Primary Examiner—George E. A. Halvosa
Attorney, Agent, or Firm—Burns, Doane, Swecker & Mathis

[57] ABSTRACT

A sheet handling device for a printer, such as a silkscreen printed circuit card printer, includes a pick-up and hold device that translates between a register position on the printer and one or more stacks of cards. Adjustable limit switches on a transport track for the device determine the positions at which its movement is interrupted. Plural knobs on a controller for the device are each assigned to one of the operations of picking up or releasing a card, and is set to one of the positions of the limit switches. The controller senses the assigned operation and position setting of each knob in sequence, and carries out the card transport operations accordingly.

4 Claims, 7 Drawing Figures

MATERIALS HANDLING DEVICE

TECHNICAL FIELD

The present invention relates to a materials handling device and above all to a materials handling device such that it consists of one or two parallel guides forming a transport track, along which an organ for gripping, taking hold of and/or stacking the material is so arranged as to be capable of being moved.

The present invention has been produced principally as a means of providing a materials handling facility in conjunction with a silk screen printing machine in which the material handled is in the form of cards which have or which are intended for an application in the area of printed circuits.

A more generalized embodiment of the invention is intended to provide a means of transporting a material from one position to one of two or more other positions or from one of two or more positions to yet another position.

The present invention is designed principally to enable the intended material to be transported before being printed in a silk screen printing machine from one or more feeder stacks to a register position and/or a printing position in the machine. The invention is also intended to enable the printed material to be transported from a silk screen printing machine to one or more stacks of finished print.

DESCRIPTION OF THE PRIOR ART

Various materials handling devices have already been disclosed which are designed to enable the intended material to be transported before being printed in a silk screen printing machine from one or more feeder stacks to a register position or a printing position in a silk screen printing machine. Also previously disclosed is a materials handling device for printed material in a silk screen printing machine which enables the printed material to be transported from the silk screen printing machine to one or more stacks of finished print.

The materials handling device for the feeder stack is usually designed in a special manner which will enable it to transport the material as required, whereas the materials handling device for the stack of finished print is usually designed in a special manner which will enable it to transport the material as required at that point.

Also previously disclosed is a materials handling device of such a nature that it may be used for both the feeder stacks and the stacks of finished print in a silk screen printing machine.

Finally, various types of materials handling devices for other applications have also been disclosed, said devices generally being of a design which corresponds directly to the shape of the material or to the function which is expected of the materials handling device.

Reference is made to English Patent Specification 1 341 978 for the purpose of illustrating a previously disclosed materials handling device in which two limit switches are used.

DESCRIPTION OF THE PRESENT INVENTION

TECHNICAL PROBLEM

A major technical problem has existed for some time now in connection with producing a materials handling device which is of such a nature that it is capable of providing efficient transport of the material without the need for it to be specially adapted to suit the surrounding equipment.

It has been found to be particularly desirable, above all in the case of silk screen printing machines, to be able to provide an identical design of materials handling device both at the feeder stack of the silk screen printing machine and at the stack of finished print of the silk screen printing machine.

It is particularly desirable in a complete silk screen printing plant consisting of feeder stacks, a silk screen printing machine, a conveyor belt, a drier and a further conveyor belt, to be able in a simple manner to provide a single materials handling device which is capable of transferring material from one conveyor to another conveyor running parallel to it, or to another conveyor running at right-angles to it and/or to and from the silk screen printing machine.

It is possible for faults to occur in certain areas of a large silk screen printing plant, and in order that the entire plant need not be stopped it is particularly desirable to provide a materials handling device of such a kind that it is not only capable of transporting the material in the manner required by the entire plant, but is also capable of satisfying a desire and of solving a problem, i.e. by providing a materials handling device of such a nature that, in the event of a fault occurring in any part of the entire plant, the said materials handling device will be capable of transporting the material to a buffer store until the fault has been corrected. The materials handling device shall then be capable of removing the material from the buffer store and of placing said material on the production line of the entire silk screen printing plant.

Where several, for instance six, silk screen printing plants are being run simultaneously, it has proved difficult to position the various feeder stacks effectively in such a manner that as one feeder stack becomes empty a new one may be introduced rapidly in its place.

It represents a major technical problem to position two feeder stacks adjacent to each other and to arrange for an organ which will take hold of and stack the material either to take a sheet of material first from one feeder stack and then from a second feeder stack, or for the organ to take material from the first feeder stack until that stack becomes empty and then to proceed to take material from a second feeder stack.

It has also been found to be the case in certain specific applications that provision must be made for the track upon which the material is conveyed to adopt an inclined attitude so that the material may be transported to different levels in the machine. A problem has also been encountered in arranging for the track upon which the material is conveyed to take hold of material in a vertical or almost vertical attitude and then to transport and stack the material in a horizontal attitude.

SOLUTION

The aim of the present invention is to provide details of a materials handling device of such a nature that it is able to solve the aforementioned complex technical problems, and where the materials handling device in accordance with the present invention is based on the principle of arranging an organ for taking hold of and stacking a sheet of material in such a way as to be capable of being moved along a transport track, preferably in the form of a system of parallel guides.

The invention is based on the assumption that three or more limit switches will be arranged along the transport track, for instance alongside the system of guides, for the purpose of defining three or more stop positions for the organ. At least two of the limit switches may be moved along the transport track so as to enable at least two of the stop positions to be changed independently of each other. The movement of the organ together with instructions for the operation to be performed at the stop position and any subsequent movement and subsequent instructions for the operation to be performed at the following stop position shall be capable of being entered as desired into a programming arrangement.

The present invention includes details of a programming arrangement of simple design incorporating a number of manually adjustable knobs. Each knob has settings corresponding to the number of stop positions, and the number of knobs is greater by one than the number of stop positions.

By means of the aforementioned programming arrangement the setting of each knob is able to indicate both the stop position and the operation to be performed, and the programming arrangement is so arranged that it will sense the setting of each knob in turn and will activate control signals corresponding to the setting.

By allocating a consecutive sequence to the knobs, it is possible to use knobs to which uneven numbers have been allocated for operations concerned with taking hold of the material, whereas knobs to which even numbers have been allocated may be used for operations concerned with the stacking of the material, or vice versa, which means that the position of the knob is of significance to the operation which the organ is to perform.

The present invention also includes details of the possibility of eliminating the limit switches, i.e. the outer movable organs, as a means of defining the stop positions of the organ. The control of the distance over which the organ is moved or of the distance which must be covered in order to move the material from one position to a second position is determined by an organ which senses the movement or the length of the movement. This sensing organ is connected to a central control device (incorporating a counting device). The equipment is designed in such a way that, at a pre-determined setting corresponding to or essentially corresponding to the distance covered by the organ between the first position and the second position, it will generate an activating signal, said activating signal causing the organ to stop, preferably by means of the driving device, once the material has reached the second position.

The central control device may be programmed in such a way that the organ will stop at any desired position, where it will then perform one of the operations "grip the material" or "stack the material", whereupon it will cause the organ to move to a new pre-programmed position.

ADVANTAGES

The advantages exhibited by a materials handling device in accordance with the present invention are mainly associated with the fact that it has succeeded in solving the technical problems indicated above. The materials handling device in accordance with the present invention has also proved capable of being manufactured as a unit which is light in weight and which may be placed in any desired position on the production line, either for the purpose of feeding material from the feeder stack to the silk screen printing machine or for the purpose of feeding printed material from the silk screen printing machine to the stacks of finished print, or for the purpose of transferring material from one conveyor to a second conveyor running parallel to and adjacent to the first conveyor, or for the purpose of transferring material from one conveyor to another conveyor running at right-angles to it. The materials handling device may also be placed in any desired position on the production line so that it will fill a buffer store in the event of a temporary fault and will then take material from the buffer store once the fault has been corrected and will place said material on the production line.

DESCRIPTION OF THE DRAWINGS

A proposed embodiment of a materials handling device in accordance with the present invention will now be described with reference to the attached drawings, in which.

DESCRIPTION OF THE PREFERRED EMBODIMENT

The present invention relates to a materials handling device which incorporates a transport track consisting of a system of parallel guides, with an organ for taking hold of and stacking the material being arranged so as to be capable of being moved along said system of guides.

Figure 1:
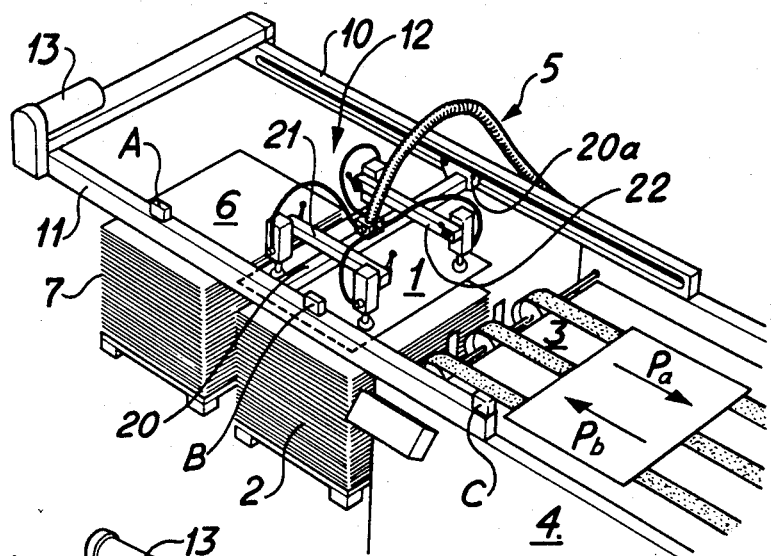
FIG. 1 shows a perspective view of the materials handling device described as being in accordance with the present invention, in use in conjunction with a silk screen printing machine and with a feeder stack or with a stack of finished print.

The materials handling device may be used in a variety of different applications, and FIG. 1 shows how the materials handling device may be used in conjunction with a silk screen printing machine, not all of which appears in the Figure.

FIG. 1 shows the manner in which the materials handling device is to be used for transporting material 1 from an initial feeder stack 2 to a register position 3 in a silk screen printing machine 4. The materials handling device 5 shall also be capable of transporting material 6 from a second feeder stack 7 to the register position 3 of the silk screen printing machine 4. The direction in which the material 1 and 6 passes along the production line is shown by the arrow "Pa".

However, the materials handling device 5 may also be used for transporting material in the direction "Pb", when it will serve as a material conveyor from the output side of a silk screen printing machine 4 to one of several finished print stacks 2 and 7, in which material 1 and 6 which has been printed is stacked.

The materials handling device 5 consists of a system of parallel guides 10, 11, along which an organ 12 for taking hold of and for stacking the material is so arranged as to be capable of being moved. The organ 12 is moved along the system of guides 10, 11 by means of a motor 13, and a beam 20 is guided by grooves in the parts 10 and 11 of the system of guides.

Three or more limit switches identified as "A", "B" and "C" are arranged on the system of guides 10, 11, more specifically on the part 11. These limit switches are intended to define three or more stop positions for the organ 12. At least two of the limit switches may be easily moved along the system of guides 11, thus enabling at least two of the stop positions to be easily changed independently of each other. The limit switches may be moved easily in grooves formed in the part 11 of the system of guides. The limit switch may incorporate a Reed switch which is activated by a permanent magnet (not shown here) attached to the organ 12.

The movement of the organ 12 which is produced by the motor 13, together with instructions for the operation which is to be performed at the respective stop positions as well as any subsequent movement and any subsequent instructions or operation which is to be performed at the following stop position may be entered as desired into a programming arrangement.

This facility for infinite adjustment offered by the programming arrangement thus enables the materials handling device to be completely flexible and not dependent upon the manner in which the materials handling device has been installed in the product line or upon the direction in which the material is conveyed along the production line.

Figure 2:
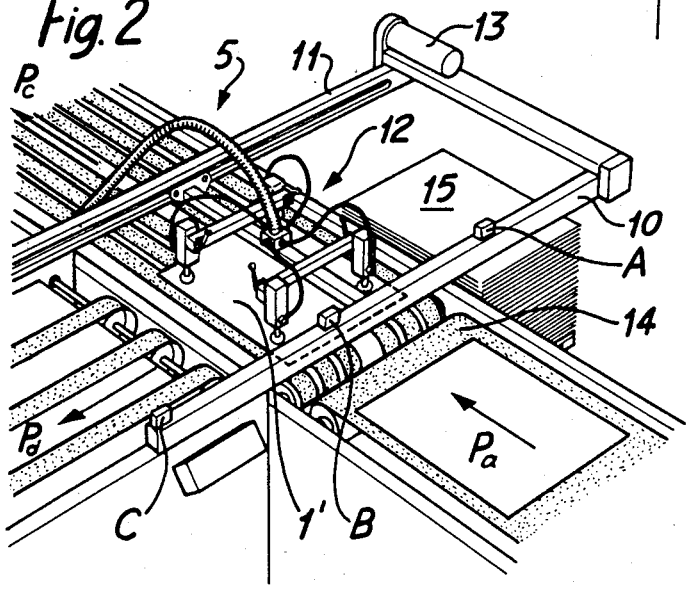
FIG. 2 shows the materials handling device in position in a production line for the purpose of transferring material to a buffer store in the event of temporary faults occurring.

FIG. 2 shows a conveyor 14 of which the direction of transport is indicated by the arrow "Pa" and where the production line is so designed that the material will be transported either in the direction of the arrow "Pc" or in the direction of the arrow "Pd".

By arranging a materials handling device 5 in accordance with the present invention, the organ 12 is able to cause a sheet of material 1' to be transported by the conveyor in the direction "Pc", or else the organ 12 may take the sheet of material 1' and transfer it to the conveyor which will cause the material 1' to move in the direction of the arrow "Pd".

In the event of a temporary interruption to the direction of movement identified as "Pc" or "Pd" the materials handling device 5 may take the material 1' intended to be moved in the direction "Pc" or "Pd" and may place said material in a buffer store 15. As soon as the fault has been corrected the materials handling device may then take the material from the buffer store 15 and place said material on the conveyor so that it will be transported in the direction "Pc" or "Pd".

Figure 3:
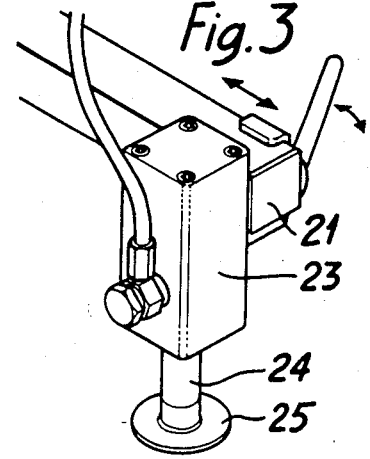
FIG. 3 shows a perspective view of an organ for taking hold of and stacking material.

FIG. 3 shows, on a rather larger scale than in FIG. 1, the organ which takes hold of and stacks the material. This organ is held by a beam 20 which operates in conjunction with the guides 10 and 11. The beam 20 supports two other beams 21 and 22 which lie at right-angles to it, each of the said beams 21 and 22 supporting two pneumatically operated holding devices, of which only one is shown in FIG. 3 and is identified with the reference 23. By means of a rod 24 which may be moved both upwards and downwards, to the free end of which is fitted a suction disc 25, the rod may be extended downwards and the disc 25 will attach itself by suction to a sheet of material 1' and will then lift the material from the conveyor, whereupon it will transfer the material to a new stop position. By releasing the suction disc in the new stop position the material 1' may be stacked in that position. The organ 12 may be fitted with a device for indicating the presence of a sheet of material which will generate an output signal and activate the programming arrangement.

Figure 4:
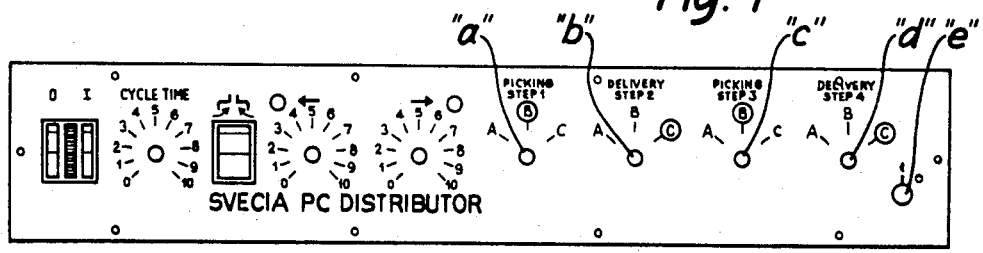
FIG. 4 shows an instrument panel which may be used in a materials handling device for the purpose of controlling a programming arrangement.

FIG. 4 shows the front panel of a programming arrangement.

Of the knobs on the front panel, the knobs "a", "b", "c" and "d" are of special interest, said knobs being manually adjustable. Each knob has settings corresponding to the number of stop positions, and in view of the three limit switches A, B and C shown in FIG. 1 each of these knobs has three different settings. The number of knobs shall be greater by one than the number of stop positions.

The setting of each knob indicates the stop position and the operation which is to be performed, and the programming arrangement is so arranged that it will sense the setting of each knob in turn from "a" to "d" and will activate the control signals corresponding to the setting. The knobs have been allocated a consecutive sequence, and knobs which have been allocated uneven numbers are intended for operations concerned with taking hold of the material, whereas knobs which have been allocated even numbers are intended for operations concerned with the stacking of the material, or vice versa.

The principle of the programming arrangement may be described in greater detail with reference to FIG. 1. On the assumption that the organ 12 will take material from the first feeder stack 2, the knob "a" is turned to the setting "B". This means that the organ 12 will stop above the feeder stack 2 and will pick up and hold the material 1. The programming arrangement will then index to the setting for the knob "b", where it will find the setting "C", which means that the organ 12 will move against the limit switch "C" and will release or stack the material 1 in position 3. The programming arrangement will then scan the setting of the knob "c", which means that the organ 12 will move to the limit switch "B" and will take the next sheet of material from the feeder stack 2. Finally, the programming arrangement will scan the setting of the knob "d" and will find that the organ 12 is to be moved to the limit switch "C" and is to stack the material in position 3 in the silk screen printing machine. The programming arrangement will then recommence the cycle, starting at the setting of the knob "a".

The material in the feeder stack 2 will run out, however, and by indicating this fact (by means of a device which is not shown here) and feeding that signal into the programming arrangement by means of a knob "e" it is possible to re-programme the knobs "a" and "c" automatically so that these knobs will return to the position "A", thereby causing the organ 12 to take material 6 from the second feeder stack 7. The knob "e" is used to indicate automatic change-over of feeder stack.

Figure 5:
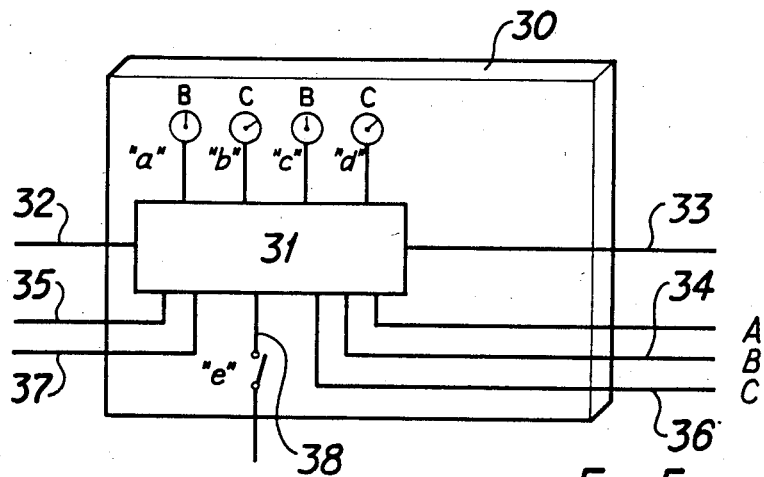
FIG. 5 shows a wiring diagram for the programming arrangement.

FIG. 5 shows a wiring diagram for the programming arrangement, from which only the principal control circuitry of the programming arrangement is evident.

The programming arrangement 30 incorporates a control unit 31 to which a start signal is connected via a lead 32.

When the start signal appears in the lead 32 the control unit 31 will scan the setting of the knob "a" and will generate an output signal in the lead 33 which will cause the motor 13 to move the organ 12 to position "B". When the signal appears in the lead 34 from the limit switch "B" the signal in the lead 33 will cease and the organ 12 will stop. The control unit is pre-programmed in such a way that the scanning of the knob "a" will generate an output signal in the lead 35, after the signal in the lead 34, which will cause the holding organ 23 to take hold of a sheet of material.

The control unit 31 will now index forward and will scan the knob "b" and will generate an output signal in the lead 33 in order to move the organ 12 to position "C". When a signal appears in the lead 36 from the limit switch "C" the signal in the lead 33 will cease and the organ 12 will stop. The control unit is pre-programmed in such a way that the scanning of the knob "b" will generate an output signal in the lead 37, after the signal in the lead 36, which will cause the holding organ 23 to stack the material.

The automatic re-programming of one or more knobs will take place when a signal appears in the lead 38, which is illustrated in this embodiment by the fact that the setting "B" for the knobs "a" and "c" will be changed to the setting "A".

The materials handling device shown here may also be used for transporting the material in an inclined attitude. There is nothing to prevent the beam 20 from being attached to its holding devices in the parts 10 and 11 of the guides in such a way that it is free to turn. Thus the guides may be set in an inclined attitude but the organ 12 will adopt a horizontal attitude.

If the pivoting attachment of the beam 20 to the holding devices 20a is controlled by means of a pneumatic cylinder with its associated ram, then the organ 12 may be rotated so that it will take hold of vertically (or essentially vertcally) oriented material and will place the material on a horizontal conveyor.

Finally, a compression device for the material may be arranged on the organ 12, which means that when the suction discs 25 take hold of the material the ends of said material will bend upwards and separate from the remaining material in the stack.

Once the material has separated, the effect of the compression device will cease and the material will assume a flat condition once more.

The motor 13 is in the form of a d.c. motor and can be controlled so as to cause the organ 12 to move at different speeds between the stop positions.

Figure 6:
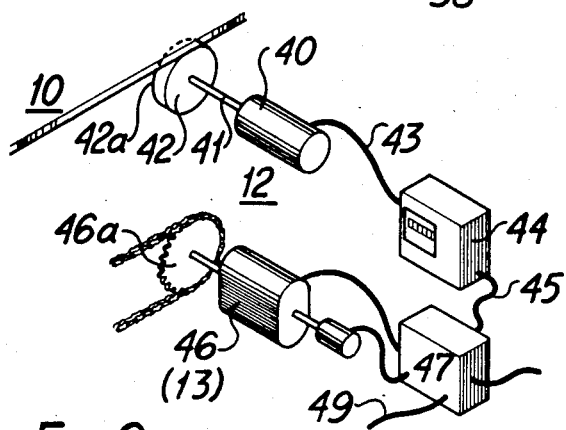
FIG. 6 shows the principle of an organ for determining the length of the movement working in conjunction with a central control device; and finally

FIG. 6 shows an embodiment in which the distance to be covered by the organ is determined by a distance-sensing organ which operates in conjunction with a central control unit.

The use of this embodiment enables the outermost limit switch or unit for determining the stop position to be eliminated.

Where there is a requirement to determine the distance to be covered by the material within close tolerances, from the first position to the second position, the present invention indicates that the movement of the organ 12 relative to the guides shall be measured by a movement-sensing organ 40. Said organ 40 shall operate in conjunction with the guides and shall be attached to the organ 12. Said movement-sensing organ 40 is in the form of an "optical shaft encoder", i.e. a device which will generate a coded output signal by means of an optical system. The device may be of the type OM25 marketed by Data Technology Inc., Mass. USA, which is designed to produce 2500 pulsations per revolution.

The device in accordance with the present invention indicates that the shaft 41 has attached to it a wheel 42, with a toothed or grooved periphery 42a, and with the diameter of said wheel 42 being selected in such a way that one pulse will be generated in the lead 43 from the organ 40 for each small longtitudinal division. In the case of the preferred embodiment the diameter of the wheel has been selected in such a way that each pulse corresponds to a distance of travel of 0.1 mm by the organ 12. The lead 43 is connected to a counting device 44 of the type "Electronic Digital Preset Counter" as manufactured by NLS, Non Linear System Corp., Calif., USA, under the model designation PR-S. The wheel 42 makes contact with the guide 10 and is thus able to measure the distance covered by the organ 12 and the material from the first position to the second position. The lead 43 is thus connected to the electronic counter 44 which measures each small longtitudinal division.

This counter may be set at a pre-determined value, said value then corresponding to the distance covered by the organ 12 from the first position to the second position, and when the counter reaches the pre-set value an activating signal will be generated via a lead 45. This activating signal is able to cause the driving device 46 in the form of a d.c. motor 13 to stop the driving motor and the organ 12 when the material has reached the second position.

Figure 7:
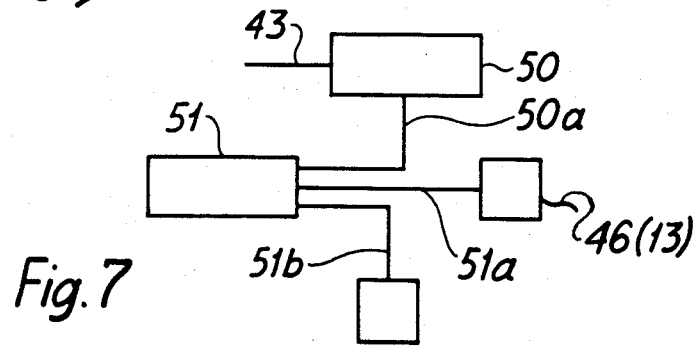
FIG. 7 shows one other embodiment.

FIG. 7 shows one other embodiment. This device incorporates a position-sensing organ 50 which is equivalent to the counter 44.

The position-sensing device 50 is controlled via the lead 43 and will indicate the position of the organ 12 along the guide 10 at any given point in time. Each small movement of the organ 12 will produce a corresponding change in the device 50.

The embodiment of the invention shown in FIG. 7 incorporates a device 51 for selecting the sequence and the operation to be performed. The sequence and any desired operation may be programmed by means of this device in accordance with the setting of the device 50. Signals corresponding to the position of the device 50 are transmitted to the selector 51 via the lead 50a.

The following are typical examples of programming of this kind:
(a) move the organ 12 to a position in which the position-sensing organ indicates a setting of 1 000;
(b) take a sheet of paper;
(c) move the organ 12 to a position in which the position-sensing organ indicates a setting of 2 400;
(d) stack the sheet of paper.

When the sequence selector has given instructions via the lead 51a for the organ 12 to be moved to the position 1 000 the driving motor 46 (13) of the organ 12 will cause the organ 12 and the position-sensing organ 50 to move to the position 1 000, when the organ 12 will stop.

This is achieved by the use of a reference circuit in the device 51, in which the pre-set value 1 000 is stored and into which the value produced by the organ 50 at any given point in time is fed.

Where the values agree or essentially agree, a signal will be generated which will stop the organ 12 in the position 1 000.

The sequence selector will now instruct the operation selector to generate a signal via the lead 51b which will cause a sheet of paper to be taken.

The sequence selector will instruct the organ 12 to be moved to position 2 400 as indicated above and will finally instruct the sequence selector to stack the sheet of paper.

The control device used in this embodiment may be in the form of the programme-controlled control unit known as the "SAIA PC" as manufactured by SODECO-SAIA AG of Murten, Switzerland.

The invention is not, of course, restricted to the typical embodiment described above, but may undergo modifications within the scope of the idea of invention.

I claim:

1. In a printing environment in which a sheet on which information to be printed is moved from a stack of sheets to a register position for a subsequent printing operation and in which a sheet having information printed thereon is moved from a finish position onto a stack of printed sheets, a materials handling device for automatically performing at least one of the operations of moving a sheet from a stack to the register position and moving a printed sheet from the finish position to a stack, comprising a transport track defining an axis of translation extending between at least one of said register and finish positions and at least one stack of sheets, a device capable of picking up and holding a sheet and translatable along said axis, means for moving said pick-up and hold device along said axis, at least three position sensors disposed at spaced locations along said transport track, one of said sensors being located at said register or finish position and another one of said sensors being located at said stack, at least two of said sensors being movable along said transport track, a plurality of knobs each having a number of settings equal to the number of sensors, each knob being assigned to one of the operations of picking up a sheet or releasing a sheet, and means responsive to said position sensors for controlling said moving means and said pick-up and hold device to move to the position and perform the operations indicated by each of said knobs in sequence so as to move said device over said stack and carry out one of the operations of picking up a sheet or dropping one onto the stack and then move to said register or finish position and perform the other of said operations.

2. The apparatus of claim 1 wherein a second stack of sheets is located along said axis, and the third one of said sensors is positioned at the location of said second stack.

3. The apparatus of claim 2 wherein said control means is responsive to an indication that one of said stacks is depleted to automatically cause said device to be translated between the other of said stacks and said register or finish position.

4. The apparatus of claim 1 wherein the number of knobs exceeds the number of sensors by one.

* * * * *